(12) United States Patent
Schlenker et al.

(10) Patent No.: US 9,196,866 B2
(45) Date of Patent: Nov. 24, 2015

(54) ORGANIC OPTOELECTRONIC DEVICE AND METHOD FOR PRODUCING AN ORGANIC OPTOELECTRONIC DEVICE

(71) Applicant: OSRAM Opto Semiconductors GmbH, Regensburg (DE)

(72) Inventors: Tilman Schlenker, Nittendorf (DE); Marc Philippens, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/383,845

(22) PCT Filed: Mar. 1, 2013

(86) PCT No.: PCT/EP2013/054204
§ 371 (c)(1),
(2) Date: Sep. 8, 2014

(87) PCT Pub. No.: WO2013/131828
PCT Pub. Date: Sep. 12, 2013

(65) Prior Publication Data
US 2015/0028318 A1  Jan. 29, 2015

(30) Foreign Application Priority Data
Mar. 8, 2012  (DE) .......................... 10 2012 203 637

(51) Int. Cl.
*H01L 51/44* (2006.01)
*H01L 51/52* (2006.01)
*H01L 27/32* (2006.01)
*H01L 51/56* (2006.01)

(52) U.S. Cl.
CPC ........ *H01L 51/5253* (2013.01); *H01L 27/3227* (2013.01); *H01L 51/448* (2013.01); *H01L 51/525* (2013.01); *H01L 51/56* (2013.01); *H01L 2251/5361* (2013.01)

(58) Field of Classification Search
CPC ................... H01L 51/5237; H01L 2251/5361; H01L 51/525; H01L 51/448; H01L 51/56
See application file for complete search history.

(56) References Cited

U.S. PATENT DOCUMENTS 6,888,308 B1   5/2005   Guenther
6,936,963 B2   8/2005   Langer et al.
(Continued)

FOREIGN PATENT DOCUMENTS

DE   102008021617 A1   10/2009
DE   102008049060 A1   4/2010
(Continued)

*Primary Examiner* — Roy Potter
*Assistant Examiner* — Paul Patton
(74) *Attorney, Agent, or Firm* — Slater & Matsil, L.L.P.

(57) ABSTRACT

An organic optoelectronic device has a first substrate, on which a functional layer stack having at least one first electrode, thereabove an organic functional layer and thereabove a second electrode is arranged. A encapsulating arrangement includes a second substrate, on which a connecting material and at least one spacer facing the functional layer stack are applied. The connecting material is arranged between the first and second substrate and mechanically connects the first and second substrate together. The functional layer stack is enclosed by the connecting material in a frame-like manner. At least one of the first and second electrode includes at least one opening, above which the at least one spacer is arranged and which has a larger lateral dimension that the spacer.

18 Claims, 3 Drawing Sheets

(56) References Cited

U.S. PATENT DOCUMENTS

| | | |
|---|---|---|
| 6,952,078 B1 | 10/2005 | Guenther |
| 6,998,776 B2 | 2/2006 | Aitken et al. |
| 8,530,924 B2 | 9/2013 | Hesse et al. |
| 2003/0094691 A1 | 5/2003 | Auch et al. |
| 2007/0210706 A1 | 9/2007 | Song et al. |
| 2011/0121352 A1* | 5/2011 | Hesse et al. .................... 257/99 |
| 2012/0091923 A1 | 4/2012 | Kastner-Jung et al. |
| 2013/0049184 A1* | 2/2013 | Kasahara et al. ............. 257/687 |
| 2013/0148062 A1* | 6/2013 | Liang et al. ................... 349/110 |

FOREIGN PATENT DOCUMENTS

| | | |
|---|---|---|
| EP | 1246509 A2 | 10/2002 |
| EP | 1240808 B1 | 5/2003 |
| EP | 1242849 B1 | 2/2007 |
| EP | 1238306 B1 | 5/2007 |
| EP | 1833106 A2 | 9/2007 |
| EP | 2323191 A2 | 5/2011 |
| JP | 2003517709 A | 5/2003 |
| JP | 2003523046 A | 7/2003 |
| JP | 2007042467 A | 2/2007 |
| JP | 2007242591 A | 9/2007 |
| JP | 2011108651 A | 6/2011 |
| JP | 2011187273 A | 9/2011 |
| KR | 20070092012 A | 9/2007 |
| TW | 201138177 A | 11/2011 |
| WO | 0144865 A1 | 6/2001 |
| WO | 0144866 A1 | 6/2001 |
| WO | 2010066245 A1 | 6/2010 |

* cited by examiner

ORGANIC OPTOELECTRONIC DEVICE AND METHOD FOR PRODUCING AN ORGANIC OPTOELECTRONIC DEVICE

This patent application is a national phase filing under section 371 of PCT/EP2013/054204, filed Mar. 1, 2013, which claims the priority of German patent application 10 2012 203 637.7, filed Mar. 8, 2012, each of which is incorporated herein by reference in its entirety.

TECHNICAL FIELD

An organic optoelectronic device and a method for producing an organic optoelectronic device are described.

BACKGROUND

U.S. Pat. No. 6,936,963 B2 and U.S. Pat. No. 6,998,776 B2 describe organic light-emitting devices which are encapsulated between a substrate and a cover glass using a glass solder.

When encapsulating such devices, as the component size increases, the risk increases that the cover glass and/or the substrate bend, for example, owing to external mechanical effects, e.g., of contact, and the functional layers between the substrate and the cover glass are damaged owing to contact by the cover glass.

SUMMARY OF THE INVENTION

Particular embodiments provide an organic optoelectronic device which has improved mechanical stability. Further object of embodiments provide a method for producing an organic optoelectronic device.

In accordance with at least one embodiment, an organic optoelectronic device comprises a first substrate. Furthermore, the device comprises a second substrate. The first and the second substrate can be formed, for example, in the manner of discs or plates. The first and the second substrate are then substantially flat. "Substantially" flat means that the first and the second substrate are flat within production tolerances and do not comprise any cavities.

In accordance with a further embodiment, the first substrate or the second substrate or both substrates comprise or consist of a glass. Alternatively, at least one of the two substrates can also comprise or consist of a ceramic material or a metal.

At least one of the two substrates is at least partially permeable for electromagnetic radiation, e.g., from the wavelength range for visible light. The first and the second substrate can be formed from the same or from mutually different materials. If one of the two substrates is formed from a radiation-impermeable material, such as metal or ceramics, for example, then the other substrate is formed to be radiation-permeable at least in places, for example, by a glass.

In accordance with at least one further embodiment, a functional layer stack is arranged on the first substrate and comprises at least one organic functional layer arranged between a first and a second electrode. The functional layer stack can be, for example, a light-emitting layer stack having at least one organic light-emitting layer, which means that the organic optoelectronic device is formed as an organic light-emitting diode (OLED). Alternatively or in addition, it is also possible that the functional layer stack is formed as a light-detecting layer stack having at least one organic light-absorbing layer, which means that the organic optoelectronic device is formed as an organic photodiode or organic solar cell.

The functional layer stack can comprise organic functional layers having organic polymers, organic oligomers, organic monomers, organic small non-polymeric molecules ("small molecules") or combinations thereof. In particular, it can be advantageous if the functional layer stack comprises an organic functional layer which is designed as a hole transport layer to permit effective hole injection into a light-emitting layer. Materials for a hole transport layer which may prove to be advantageous are, for example, tertiary amines, carbazole derivatives, conductive polyaniline or polyethylenedioxythiophene. Suitable materials for the light-emitting layer are materials which have radiation emission owing to fluorescence or phosphorescence, e.g., polyfluorene, polythiophene or polyphenylene or derivatives, compounds, mixtures or copolymers thereof. Furthermore, the functional layer stack can comprise an organic functional layer which is formed as an electron transport layer. Moreover, the functional layer stack can also comprise organic electron- and/or hole-blocking layers. The functional layer stack can also comprise a plurality of organic light-emitting or—absorbing layers which are arranged between the electrodes.

With regard to the basic structure of an organic light-emitting device, thus for example with regard to the structure, layer composition and the materials of the functional layer stack, reference is made to document WO 2010/066245 A1, also published as U.S. Patent Publication No. 2012/0091923, which is hereby explicitly incorporated by reference, in particular with regard to the structure of an organic light-emitting device.

The electrodes can each be formed over a wide area. As a result, in the case of an organic optoelectronic device formed as an OLED, the electromagnetic radiation generated in the organic light-emitting layer can be emitted over a wide area. "Over a wide area" can mean that the organic light-emitting device has an area of greater than or equal to a few square millimeters, preferably greater than or equal to one square centimeter and in a particularly preferred manner greater than or equal to one square decimeter.

In accordance with a further embodiment, the second substrate is formed as part of an encapsulating arrangement. The encapsulating arranged can further comprise a connecting material which is applied on the second substrate in a frame-like manner. In particular, the connecting material is arranged between the first and the second substrate and connects the two substrates together. The connecting material can, for example, directly adjoin the upper surfaces of the first and the second substrate.

In particular, the connecting material encloses the functional layer stack in a frame-like manner so that the functional layer stack is arranged in a hollow space formed by the first and the second substrate and the connecting material arranged therebetween. "In a frame-like manner" provides no reference as to the geometry of the progression of the connecting material. The connecting material can be formed as a strip around the functional layer stack in a square, rectangular, round, oval manner or as another geometric shape. The connecting material extends in a closed path around the functional layer stack and encloses same, for example, on the side.

In accordance with a further embodiment, the encapsulating arrangement further comprises at least one spacer which is arranged on the side of the second substrate facing the functional layer stack. Preferably, the at least one spacer is located on the same side of the second substrate as the connecting means. In particular, the at least one spacer is fixedly connected to the upper surface of the second substrate, which surface faces the functional layer stack. The fact that two elements are "fixedly connected" means here and hereinafter that the two elements are connected to each other such that they do not become detached from one another under normal processing or operating conditions of the device. A fixed connection can be provided, for example, by an adhesive connection, by a fused joint or by a sintered connection. In a particularly preferred manner, the at least one spacer is sintered onto the second substrate.

In accordance with a further embodiment, at least one of the electrodes, i.e., at least one of the first and second electrodes, comprises at least one opening. An "opening" means here and hereinafter a region of the first or second electrode which is free of the electrode material of the first or second electrode formed in a layer-like manner and is surrounded and enclosed by the electrode material in the layer plane of the electrode. This also means that the electrode having the at least one opening is not divided by the opening into two mutually separate sub-regions. Rather, the electrode having the at least one opening is formed by a layer which is contiguous in the layer plane or a contiguous layer stack having the at least one opening. Directions along the extension of the layer plane of the electrode having the at least one opening are also referred to here and hereinafter as lateral directions.

The region of the layer stack in which the at least one opening is located is an inactive region since the first or second electrode is not provided in this region. This means that the functional layer stack and thus the organic optoelectronic device preferably comprises a contiguous, large and active region, in which at least one inactive region is arranged.

In accordance with a further embodiment, the at least one spacer is arranged above the at least one opening. "Arranged above the opening" means that the projection of the at least one spacer on the layer plane of the electrode having the at least one opening lies within the at least one opening. The at least one spacer can be arranged in the vertical direction, i.e., in a direction perpendicular to the layer plane of the electrode having the at least one opening, spaced apart from and above the opening, or alternatively it can also protrude into the opening.

In accordance with a further embodiment, the at least one opening has a larger lateral dimension than the at least one spacer. For example, the at least one opening can have a larger cross-section, i.e., larger edge dimensions and/or a larger diameter, than the at least one spacer in the lateral direction. This means that the at least one spacer, even in the case that it protrudes into the at least one opening, does not contact the electrode material of the electrode having the at least one opening and thus is not in contact with the electrode having the at least one opening.

In accordance with a particularly preferred embodiment, the organic optoelectronic device comprises a first substrate and an encapsulating arrangement having a second substrate. Arranged on the first substrate is a functional layer stack having at least one first electrode, thereabove an organic functional layer and thereabove a second electrode. The encapsulating arrangement comprises, on the second substrate, a connecting material and at least one spacer facing the functional layer stack which are fixedly connected to the second substrate, wherein the connecting material is arranged between the first and second substrate and fixedly connects the first and second substrate to each other, wherein the functional layer stack is enclosed by the connecting material in a frame-like manner, and wherein at least one of the first and second electrode comprises at least one opening, above which the at least one spacer is arranged and which has a larger lateral dimension than the spacer.

The organic optoelectronic device described herein is based on the knowledge that in the case of organic optoelectronic devices over a wide area, there is the risk that the first and second substrate are pressed together by external pressure effects and thus mechanical loads such that damage can occur to the functional layer stack.

This problem does not occur, for example, when encapsulating organic displays, i.e., display apparatuses, since the display is divided into very small, locally delimited organic light elements in the form of pixels which are separated from each other by lacquer rings, lacquer bridges or other spacers. These spacers ensure a constant spaced disposition between the first and second substrate which means that the risk of damage to the device by pressing together the first and second substrate is greatly reduced.

In order to avoid damage by pressing together the first and second substrate even for components over a wide area which are used, for example, as general illumination or as solar cells, the device described herein makes use of the fact that at least one spacer is fixedly connected to the upper surface of the second substrate facing the functional layer stack. When pressing together the first and second substrate, the pressure load is absorbed by the at least one spacer and is distributed thereby. By virtue of the fact that the at least one spacer is arranged above the at least one opening of the first or second electrode, the at least one spacer is located above an optoelectronically inactive region of the functional layer stack. Contacting of the functional layer stack by the spacer therefore does not have a disadvantageous effect on the active region of the functional layer stack even if the at least one spacer were to damage the functional layer stack in the inactive region. In this manner, the risk of damage, in locations, of the organic optoelectronic device in the active region is considerably reduced or even completely obviated.

In accordance with a further embodiment, the at least one spacer is fixedly connected only to the second substrate. This means that the at least one spacer is arranged loosely and without a fixed connection to the functional layer stack and to the first substrate. Preferably, the connecting material is selected to be so thick that after assembling the first and second substrate a cavity is formed in which there is space for the functional layer stack and the at least one spacer.

In accordance with a further embodiment, the at least one spacer comprises, in the vertical direction, a smaller height than the connecting material. The at least one spacer therefore cannot contact the functional layer stack in the normal state of the organic optoelectronic device and can be arranged at a spaced disposition with respect thereto. "Normal state" refers here and hereinafter to the arrangement of the individual elements of the organic optoelectronic device with respect to each other, which elements are present under normal operation or storage conditions without additional external pressure. That is to say that after assembly there is a spaced disposition between the spacer and the functional layer stack. Preferably, a gap is formed which is filled, for example, with a gas which may be present between the first substrate and the encapsulating arrangement. For example, under mechanical loading the second substrate is lowered with the spacer in the direction of the functional layer stack. The spacer provides a minimum spaced disposition between the first and second substrate.

Furthermore, it can also be possible that the at least one spacer contacts the functional layer stack in the normal state. The height of the at least one spacer can also be smaller than the height of the connecting material in this case. This is then possible above all if the height of the spacer is selected such that it contacts the functional layer stack or a component arranged on the layer stack. For example, in the case of a first electrode with at least one opening, the at least one spacer can contact the second electrode. In the case of a second electrode with at least one opening, this can mean that the spacer contacts the organic functional layer arranged below the second electrode.

In accordance with a further embodiment, the device comprises a plurality of openings in the first or second electrode and a plurality of spacers, wherein one spacer is arranged in each case above each of the openings. By way of a plurality of spacers, an external pressure effect, which would result in the first and second substrates being pressed together causing damage to the functional layer stack, can be very effectively distributed and compensated for. For example, the spacers and openings can be arranged uniformly, i.e., approximately in a regular arrangement in the lateral direction.

In accordance with a further embodiment, the first electrode comprises the at least one opening. The at least one organic functional layer and the second electrode can cover the at least one opening. Alternatively, the second electrode can also comprise the at least one opening, and the at least one organic functional layer and the first electrode can be arranged in the region of the opening. In other words, all the layers of the functional layer stack, with the exception of the electrode having the at least one opening, can be formed over a wide area and without an opening.

In accordance with a further embodiment, the material of the at least one spacer and the connecting material are identical. "Identical" hereby means that the material of the at least one spacer and of the connecting material are composed of the same materials or material combinations. The connecting material and the at least one spacer can furthermore be applied onto the second substrate in the same method step.

In accordance with a further embodiment, the connecting material and the material of the at least one spacer is a glass-containing material. This means that the connecting material and the material of the at least one spacer contain at least one glass. For example, the glass-containing material can be a glass solder or a glass frit material. The glass-containing connecting material and the material of the at least one spacer can be present in a matrix material which provides the connecting material and the material of the at least one spacer with a toothpaste-like consistency when applying the connecting material, for example, onto the second substrate. The connecting material and the material of the at least one spacer can be applied onto the upper surface of the second substrate by screen printing, coating with a doctor blade, rippling or similar methods, and then dried and sintered. In order to connect the first and second substrate, the connecting material is then melted locally, which can be effected, for example, by a laser beam. Preferably, the material of the at least one spacer is no longer melted which means that the at least one spacer, as described above, is fixedly connected only to the second substrate.

Furthermore, it can also be possible that only the at least one spacer is formed of a glass-containing material and the connecting material is, for example, formed of a synthetic material, e.g., an adhesive.

The encapsulating arrangement can furthermore comprise a getter material arranged next to the at least one spacer, which getter material is suitable to absorb or bind moisture and/or oxygen and/or other substances damaging the functional layer stack.

In accordance with a further embodiment, a method for producing an organic optoelectronic device comprises the following steps. A first substrate is provided. A functional layer stack with at least one first electrode is disposed thereon. Thereabove an organic functional layer and thereabove a second electrode are arranged. At least one of the first and second electrode comprises at least one opening. An encapsulating arrangement is arranged on the first substrate.

The features and embodiments described for the organic optoelectronic device apply accordingly to the method, and vice versa.

In accordance with a further embodiment, providing the encapsulating arrangement comprises the following partial steps: B1) providing a second substrate, B2) applying connecting material onto an upper side of the second substrate, B3) applying at least one spacer onto the upper side of the second substrate, B4) connecting at least the at least one spacer to the second substrate by a sintering process.

In accordance with a further embodiment, the functional layer stack is enclosed by the connecting material and the at least one spacer is arranged above the least one opening.

In accordance with a further embodiment, in addition, the connecting material is connected to the second substrate by the sintering process and the connecting material is melted by a laser and is fixedly connected to the first substrate.

BRIEF DESCRIPTION OF THE DRAWINGS

Further advantages, advantageous embodiments and developments will be apparent from the exemplified embodiments described hereinafter in conjunction with the figures, in which.

Figure 1A:
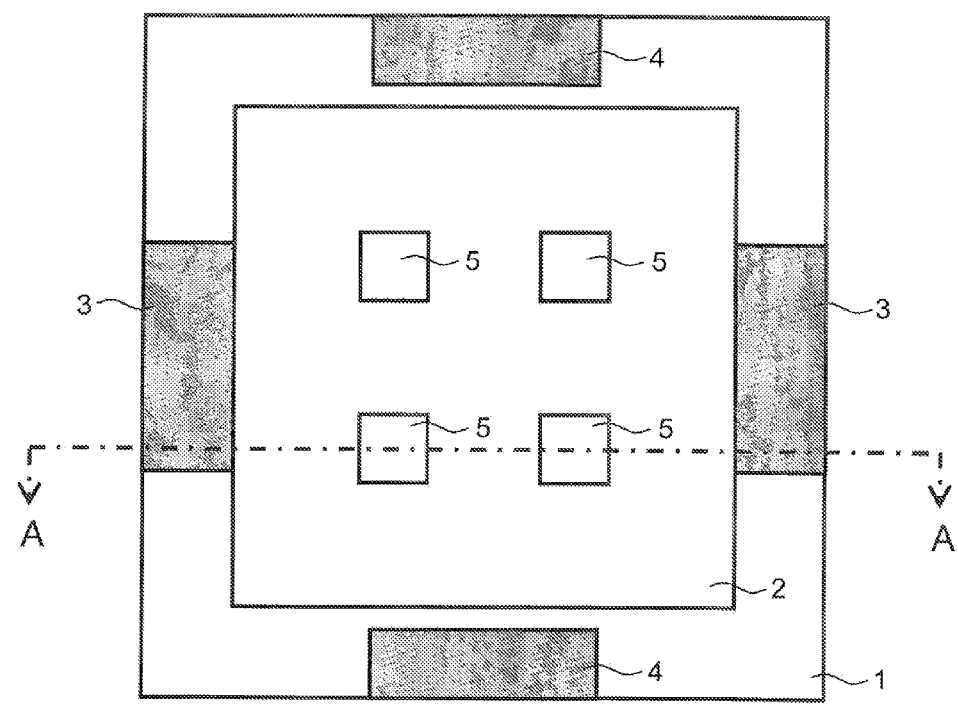
FIGS. 1A to 5 show schematic illustrations of method steps for producing an organic optoelectronic device in accordance with one exemplified embodiment.

In the exemplified embodiments and figures, like or similar elements or elements acting in a like manner may each be provided with the same reference numerals. The illustrated elements and their size ratios with respect to each other are not to be regarded as being to scale, rather individual elements such as, for example, layers, components, devices and regions, can be illustrated excessively large for improved clarity and/or for ease of understanding.

DETAILED DESCRIPTION OF ILLUSTRATIVE EMBODIMENTS

Figure 3A:
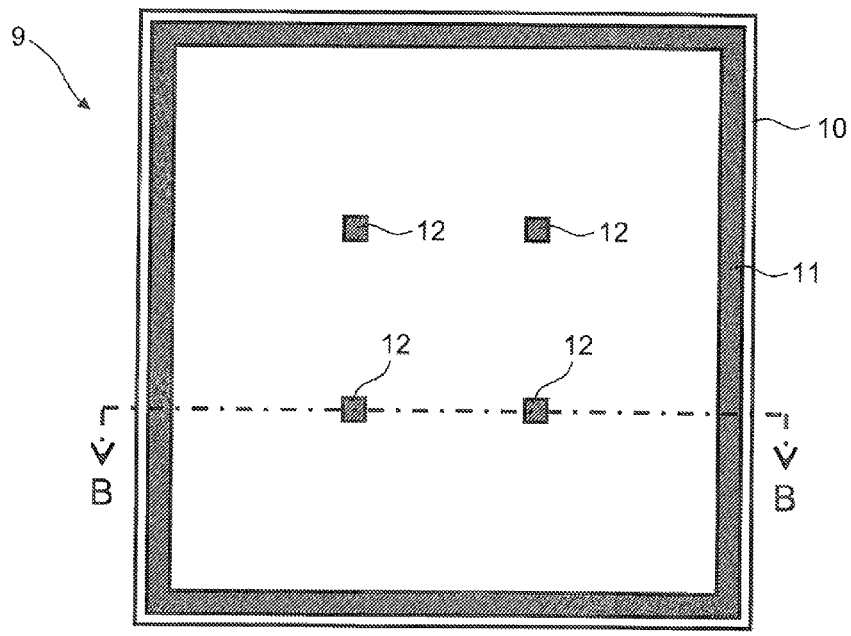
Figure 3B:
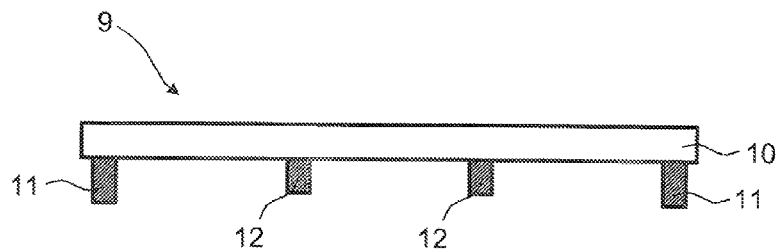
Figure 4:
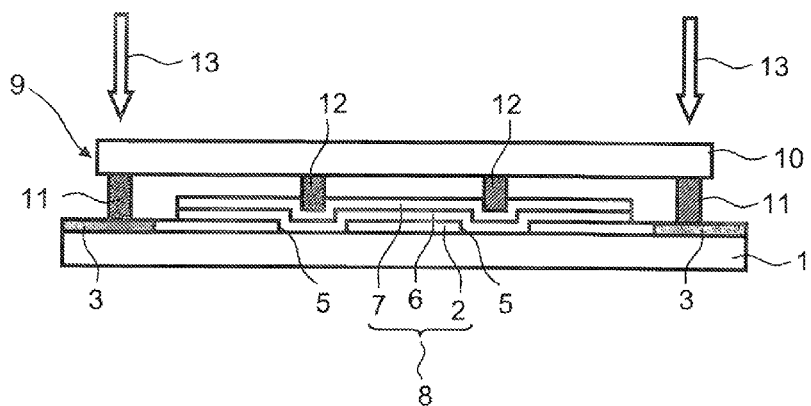
Figure 5:
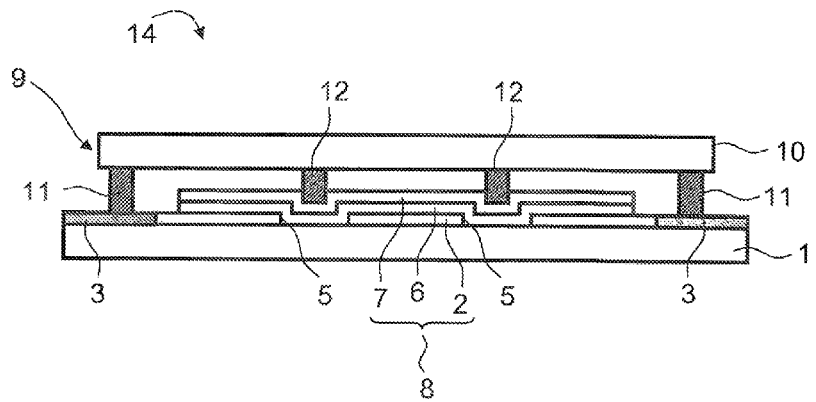

FIGS. 1A to 5 illustrate a method for producing an organic optoelectronic device 14 in accordance with one exemplified embodiment, which device, as shown in FIG. 5, comprises on a first substrate 1 a functional layer stack 8 having at least one first electrode 2, thereabove an organic functional layer 6 and thereabove a second electrode 7. Arranged thereabove is an encapsulating arrangement 9 which comprises a second substrate 10, on which a connecting material 11 and at least one spacer 12 facing the functional layer stack 8 are applied and are fixedly connected to the second substrate 10, wherein the connecting material 11 is arranged between the first and second substrate 1, 10 and connects the first and second substrate 1, 10 together, wherein the functional layer stack 8 is enclosed by the connecting material 11 in a frame-like manner and wherein the first electrode 2 comprises at least one opening 5, above which the at least one spacer 12 is arranged and which has a larger lateral dimension than the spacer 12.

The organic optoelectronic device 14 is designed in the illustrated exemplified embodiment as an organic light-emitting diode and comprises, as at least one organic functional layer 6, at least one organic light-emitting layer which can generate light during operation of the device 14. Furthermore, the functional layer stack 8, as described in the general part, can comprise further organic functional layers, e.g., charge carrier transport layers and/or charge carrier blocking layers.

As an alternative to the illustrated exemplified embodiment, the organic optoelectronic device 14 can also be formed, for example, as an organic light-detecting device, for example, as an organic photodiode or organic solar cell, and can comprise corresponding organic functional layers 6 between the first and second electrode 2, 7.

Further features of the organic optoelectronic device 14 will be described in conjunction with the following description for producing the device 14 in conjunction with FIGS. 1A to 5.

Figure 1B:
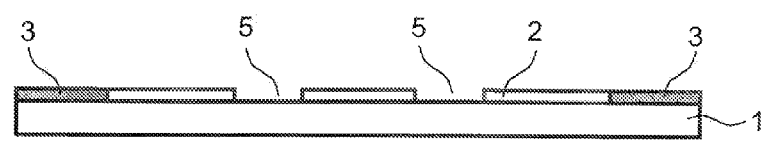

FIGS. 1A and 1B illustrate a first method step in which the first substrate 1 having the first electrode 2 is provided. The illustration of FIG. 1B corresponds to a sectional illustration of the substrate 1 having the first electrode 2 in the sectional plane AA shown in FIG. 1A.

The first substrate 1 is a substrate formed as a disc, which substrate can be formed, for example, from a glass or consists of a glass. For example, the first substrate 1 consists of a soda-lime glass (window glass), which is particularly cost-effective compared with, for example, a boron-silicate glass.

Arranged on the upper side of the first substrate 1 is the first electrode 2 which, in the illustrated exemplified embodiment, is formed as an anode and comprises or consists of, for example, a transparent conductive oxide (TCO), e.g., zinc oxide, tin oxide, cadmium oxide, titanium oxide, indium oxide or indium tin oxide (ITO). The first electrode 2 is applied in a layer-like manner and is surrounded in a lateral direction, that is to say in a direction in parallel with the layer extension plane, by an edge region of the first substrate 1 which is free of the electrode material of the first electrode 2.

Arranged in the edge region are connection pieces 3 and 4, for example, consisting of a metal, a TCO or a combination thereof, which are used for externally contacting the first electrode 2 and the second electrode 7 in the subsequently finished device 14. The connection pieces 3, 4 are illustrated in their arrangement purely by way of example and can differ from the illustrated exemplified embodiment in terms of their respective shape, number and position.

The first electrode 2 further comprises the at least one opening 5, above which, as shown in FIG. 5, at least one spacer element 12 is arranged. In the illustrated exemplified embodiment, four openings 5 are shown purely by way of example, which are distributed uniformly, i.e., regularly in the lateral direction, over the first electrode 2. Alternatively, depending upon the size or area of the organic optoelectronic device 14 and depending upon the strength of the individual elements of the device 14, in particular the substrates 1 and 10, more or fewer openings 5 can be arranged, which openings can be distributed uniformly or even non-uniformly. For example, it is also possible that only a single opening 5 is provided, e.g., in the center of the first electrode 2.

The openings 5 are formed by regions of the first electrode 2 in which no electrode material is provided and which are enclosed by the electrode material in the lateral direction. The first electrode 2 is thus formed as a contiguous layer, over a wide area, having the openings 5, wherein the openings 5 do not divide the first electrode 2 into individual separated functional regions.

The quadratic shape of the openings 5 shown in FIG. 1A is purely by way of example. The openings 5 can also have another polygonal cross-section or even a round cross-section, for example, a circle or ellipse.

Figure 2:
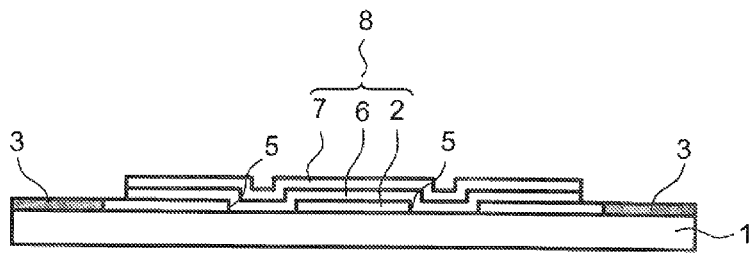

In a further method step, as shown in FIG. 2, the at least one organic functional layer 6 and the second electrode 7 are applied. These layers are applied over a wide area and thus also above the openings 5 of the first electrode 2. In the illustrated exemplified embodiment, the second electrode 2 is formed as a cathode and comprises, for example, a metal or an alloy, for instance Ag, Pt, Au, Mg or mixtures thereof, e.g., Ag:Mg.

As an alternative to the illustrated design with the first electrode 2 as an anode and the second electrode 7 as a cathode, the functional layer stack 8 can also have a reversed polarity, wherein the anode and the cathode are interchanged.

In a further method step as shown in FIGS. 3A and 3B, an encapsulating arrangement 9 is produced. The illustration of FIG. 3B corresponds to a sectional illustration of the encapsulating arrangement 9 in the sectional plane BB shown in FIG. 3A.

In order to produce the encapsulating arrangement 9, the second substrate 10 is provided in a first partial step, which second substrate comprises, in the illustrated exemplified embodiment, the same material as the first substrate 1. Alternatively, another material is also feasible, e.g., a metal or a ceramic material.

In further partial steps, the connecting material 11 and the spacers 12 are applied onto the second substrate 2. The positions of the spacers 12 correspond to the positions of the openings 5 in the first electrode 2, which means that after assembling the encapsulating arrangement 9 with the first substrate 1, on which the functional layer stack 8 is arranged, each of the spacers 12 is arranged in each case above an opening 5, as shown in FIG. 5.

The connecting material 11 and the material of the spacers 12 are preferably applied using the same method. For example, the respective material can be rippled onto the second substrate 2, coated thereon using a doctor blade or printed thereon. Preferably, the connecting material 11 and the material of the spacers 12 are identical and comprise or consist of a glass-containing material, for example, a glass solder or glass frit material.

The connecting material 11 is applied in a sufficient thickness so that after assembling the two substrates 1, 10 there is space between the two substrates 1, 10 for the functional layer stack 8 and the spacers 12. Furthermore, the connecting material 11 is applied in a frame-like manner so that the connecting material 11 can, in the finished device 14 as shown in FIG. 5, enclose the functional layer stack 8 and, together with the first and second substrate 1, 10, forms a hollow space in which the functional layer stack 8 is arranged.

The spacers 12 have, compared with the connecting material 11, a smaller height, whereby, as described further below, in the finished device an adjustment can be made as to whether or not the spacers 12 contact the functional layer stack 8 in the normal state.

Then, in a further partial step, the connecting material 11 and the material of the spacers 12 are fixedly connected to the second substrate 2 by, preferably, a drying step and a single sintering process. This has the advantage that the process is particularly cost-effective and the device can be produced quickly since intermediate steps in the production can be omitted.

It is furthermore still possible that, for example, a getter material is applied onto the second substrate 10 between the spacers 12 and the connecting material 11, which getter material can bind, for example, moisture and/or oxygen.

The spacers 12 can, as shown in FIG. 5, each have such a height that the spacers 12 contact, in the finished device 14, the functional layer stack 8 in the normal state, i.e., under normal storage and operating conditions without additional external pressure effects. As a result, a substantially identical spaced disposition of the first substrate 1 with respect to the second substrate 10 under pressure effects can be achieved so that the organic optoelectronic device 14 has approximately the same thickness over the entire area even in the case of external pressure effects.

Alternatively, it is also possible that the spacers 12 have such a height that that a, for example, gas-filled gap is provided between the spacers 12 and the functional layer stack 8, and that the spacers 12 are thus arranged vertically spaced apart from the functional layer stack 8 in the normal state. In the case of only slight external pressure effects which cause only slight deformation of the first and/or second substrate 1, 10, depending upon the size of the gap contact between the spacers 12 and the functional layer stack 8 can be avoided. If, under larger mechanical loading, the second substrate 10 with the spacers 12 is lowered further in the direction of the functional layer stack 8, the spacers 12 then ensure a minimum spaced disposition between the first and second substrate 1, 10.

The square cross-section, shown in FIG. 3A, of the spacers 12 is purely by way of example, as already described in conjunction with the openings 5. The spacers 12 can also have another polygonal cross-section or even a round cross-section, e.g., a circle or ellipse. The cross-section of the spacers 12 does not necessarily have to coincide with the cross-section of the openings 5.

The spacers 12 have, as can be seen in FIG. 5, lateral dimensions which are smaller than the lateral dimensions of the openings 5. The spacers 12 thus project, in the finished device 14, onto the layer plane of the first electrode 2 within the openings 5. As a result, after assembling the encapsulating arrangement 9 with the first substrate 1 and the layer stack 8 arranged thereon, it can be ensured that the spacers 12 cannot contact and thereby damage the first electrode 2 even in the event of large pressure effects and that the spacers 12 can contact the functional layer stack 8 only in inactive regions.

In a further method step, as shown in FIG. 4, the encapsulating arrangement 9 is placed onto the first substrate 1 so that the connecting material 11 encloses the functional layer stack 8 and the spacers 12 are arranged above the openings 5.

By using preferably a laser, as indicated by the arrows 13, the first and second substrates 1, 10 are fixedly connected together in those regions in which the connecting material 11 extends. The connecting material 11 is heated by the laser 13 and is melted, for example, at least partially and, after cooling, fixedly mechanically connects the first substrate 1 to the second substrate 10. The spacers 12 are not heated since they do not provide any connection between the substrates 1, 10.

As an alternative to the illustrated exemplified embodiment, it is also possible that the connecting material 11 comprises a synthetic material, e.g., an adhesive. In this case, in order to produce the encapsulating arrangement 9, only the spacers 12 are applied and sintered, as previously described. The connecting material 11 is then applied onto the second substrate 10 in a frame-like manner around the spacers 12. Alternatively, it is also possible to apply the connecting material 11 onto the first substrate 1 in a frame-like manner around the functional layer stack 8.

Figure 6:
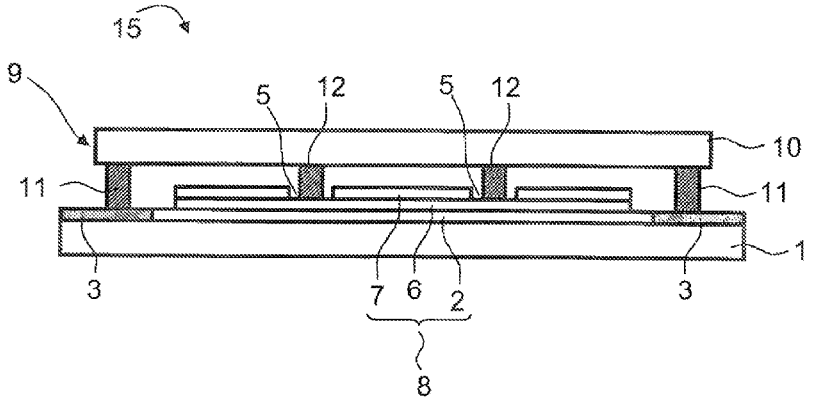
FIG. 6 shows a schematic illustration of an organic optoelectronic device in accordance with a further exemplified embodiment.

FIG. 6 illustrates an organic optoelectronic device 15 in accordance with a further exemplified embodiment, which is a modification of the preceding exemplified embodiment and in which, in contrast to the preceding exemplified embodiment, instead of the first electrode 2 the second electrode 7 comprises the at least one opening 5 in the form of a plurality of openings 5.

The first electrode 2 and the at least one organic functional layer 6, preferably all the organic functional layers, of the functional layer stack 8 are applied in an unstructured manner and are also located in the regions of the openings 5 in the second electrode 7.

As shown in FIG. 6, the spacers 12 of the encapsulating arrangement 9 can protrude into the openings 5 of the second electrode 7 and furthermore, for example, can contact the at least one organic functional layer 6 beneath the second electrode 7. Alternatively, it is also possible that the spacers 12 only partially protrude into the openings 5 and do not contact the layers located beneath the second electrode 7 in the normal state. Furthermore, it is also possible that the spacers 12 are arranged vertically spaced apart above the openings 5.

As an alternative to the illustrated exemplified embodiments, it is also possible that the two electrodes 2, 7 each comprise at least one opening 5 or a plurality of openings 5. These can be arranged in the lateral direction above one another and/or also offset with respect to each other since each region of the functional layer stack 8 in which in each case at least one opening 5 is provided in at least one of the electrodes 2, 7 is an inactive region, above which one spacer 12 of the encapsulating arrangement 9 can be arranged.

The invention is not limited to the exemplified embodiments by the description using same. Rather, the invention includes each new feature and each combination of features included in particular in each combination of features in the claims, even if this feature or this combination itself is not explicitly stated in the claims or exemplified embodiments.

The invention claimed is:

1. An organic optoelectronic device comprising:
   a first substrate on which a functional layer stack is arranged, wherein the functional layer stack has at least one first electrode, thereabove an organic functional layer and thereabove a second electrode; and
   an encapsulating arrangement which comprises a second substrate, on which a connecting material and a spacer facing the functional layer stack are located and are fixedly connected to the second substrate, wherein the spacer is fixedly connected only to the second substrate,
   wherein the connecting material is arranged between the first substrate and the second substrate, and mechanically connects the first and second substrates together,
   wherein the functional layer stack is enclosed by the connecting material in a frame-like manner, and
   wherein at least one of the first electrode or the second electrode comprises an opening, above which the spacer is arranged, the opening having a larger lateral dimension than the spacer.

2. The device according to claim 1, wherein the electrode having the opening is formed by a contiguous layer or a contiguous layer stack.

3. The device according to claim 1, wherein the first electrode comprises the opening and the organic functional layer, and wherein the second electrode covers the opening.

4. The device according to claim 1, wherein the second electrode comprises the opening and the organic functional layer and the first electrode are arranged in a region of the opening.

5. The device according to claim 1, wherein the connecting material and the material of the spacer are identical.

6. The device according to claim 1, wherein the connecting material and the material of the spacer contain glass.

7. The device according to claim 6, wherein the connecting material and the material of the spacer are formed by a glass solder or a glass frit.

8. The device according to claim 1, wherein the spacer does not contact the functional layer stack.

9. The device according to claim 1, wherein the spacer contacts the functional layer stack.

10. The device according to claim 1, wherein the spacer has a smaller height than the connecting material.

11. The device according to claim 1, wherein the spacer is one of a plurality of spacers applied on the second substrate and the opening is one of a plurality of openings, each spacer is arranged above a respective one of the openings.

12. A method for producing an organic optoelectronic device, the method comprising:
   providing a first substrate on which a functional layer stack is arranged, wherein the functional layer stack has a first electrode, thereabove an organic functional layer and thereabove a second electrode, and wherein at least one of the first electrode and the second electrode comprises an opening;
   providing a second substrate;
   applying a connecting material onto an upper side of the second substrate;
   applying a spacer onto the upper side of the second substrate;
   connecting the spacer to the second substrate by a sintering process thereby producing an encapsulating arrangement; and
   arranging the encapsulating arrangement on the first substrate so that the functional layer stack is enclosed by the connecting material and the spacer is arranged above the opening.

13. The method according to claim 12, wherein connecting the spacer to the second substrate comprises connecting the connecting material to the second substrate by the sintering process.

14. The method according to claim 13, wherein the arranging the encapsulating arrangement comprises melting the connecting material with a laser to fixedly connect the connecting material to the first substrate.

15. The method according to claim 12, wherein the opening has a larger lateral dimension than the spacer.

16. An organic optoelectronic device comprising:
   a first substrate on which a functional layer stack is arranged, wherein the functional layer stack has at least one first electrode, thereabove an organic functional layer and thereabove a second electrode; and
   an encapsulating arrangement which comprises a second substrate, on which a connecting material and a spacer facing the functional layer stack are located and are fixedly connected to the second substrate,
   wherein the connecting material is arranged between the first substrate and the second substrate and mechanically connects the first and second substrates together,
   wherein the functional layer stack is enclosed by the connecting material in a frame-like manner,
   wherein at least one of the first electrode or the second electrode comprises an opening, above which the spacer is arranged, the opening having a larger lateral dimension than the spacer, and
   wherein the first electrode comprises the opening, and wherein the organic functional layer and the second electrode cover the opening.

17. An organic optoelectronic device comprising:
   a first substrate on which a functional layer stack is arranged, wherein the functional layer stack has at least one first electrode, thereabove an organic functional layer and thereabove a second electrode; and
   an encapsulating arrangement which comprises a second substrate, on which a connecting material and a spacer facing the functional layer stack are located and are fixedly connected to the second substrate, wherein the connecting material and the material of the spacer are identical,
   wherein the connecting material is arranged between the first substrate and the second substrate and mechanically connects the first and second substrates together,
   wherein the functional layer stack is enclosed by the connecting material in a frame-like manner, and
   wherein at least one of the first electrode or the second electrode comprises an opening, above which the spacer is arranged, the opening having a larger lateral dimension than the spacer.

18. An organic optoelectronic device comprising:
   a first substrate on which a functional layer stack is arranged, wherein the functional layer stack has at least one first electrode, thereabove an organic functional layer and thereabove a second electrode; and
   an encapsulating arrangement which comprises a second substrate, on which a connecting material and a spacer facing the functional layer stack are located and are fixedly connected to the second substrate,
   wherein the connecting material is arranged between the first substrate and the second substrate and mechanically connects the first and second substrates together,
   wherein the functional layer stack is enclosed by the connecting material in a frame-like manner,
   wherein the spacer does not contact the functional layer stack, and
   wherein at least one of the first electrode or the second electrode comprises an opening, above which the spacer is arranged, the opening having a larger lateral dimension than the spacer.

* * * * *